(12) United States Patent
Tsai et al.

(10) Patent No.: US 8,735,260 B2
(45) Date of Patent: May 27, 2014

(54) METHOD TO PREVENT METAL PAD DAMAGE IN WAFER LEVEL PACKAGE

(75) Inventors: Shang-Ying Tsai, Pingzhen (TW);
Jung-Huei Peng, Jhubei (TW);
Hsin-Ting Huang, Bade (TW);
Hung-Hua Lin, Taipei (TW);
Ming-Tung Wu, Hsinchu (TW);
Ping-Yin Liu, Yonghe (TW); Yao-Te Huang, Hsinchu (TW); Yuan-Chih Hsieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 461 days.

(21) Appl. No.: 12/966,756

(22) Filed: Dec. 13, 2010

(65) Prior Publication Data

US 2012/0149152 A1    Jun. 14, 2012

(51) Int. Cl.
*H01L 21/30*    (2006.01)
*H01L 21/46*    (2006.01)

(52) U.S. Cl.
USPC ................................. 438/456; 438/107

(58) Field of Classification Search
USPC .................. 438/455, 458, 459, 106, 107, 109
See application file for complete search history.

(56) References Cited

U.S. PATENT DOCUMENTS

| 5,866,469 A * | 2/1999 | Hays .............................. 438/456 |
| 7,344,959 B1 * | 3/2008 | Pogge et al. .................. 438/459 |

* cited by examiner

*Primary Examiner* — Jae Lee
*Assistant Examiner* — Quovaunda V Jefferson
(74) *Attorney, Agent, or Firm* — Haynes and Boone, LLP (57) ABSTRACT

The present disclosure provide a method of manufacturing a microelectronic device. The method includes forming a bonding pad on a first substrate; forming wiring pads on the first substrate; forming a protection material layer on the first substrate, on sidewalls and top surfaces of the wiring pads, and on sidewalls of the bonding pad, such that a top surface of the bonding pad is at least partially exposed; bonding the first substrate to a second substrate through the bonding pad; opening the second substrate to expose the wiring pads; and removing the protection material layer.

20 Claims, 11 Drawing Sheets

METHOD TO PREVENT METAL PAD DAMAGE IN WAFER LEVEL PACKAGE

BACKGROUND

In wafer level packaging of a micro-electro mechanical system (MEMS) device, an eutectic bonding method is implemented. However, the broken silicon fragments generated during the dicing and grinding processes may scratch the metal pads and induce serious pad corrosion. Therefore, a method for wafer level packaging is needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
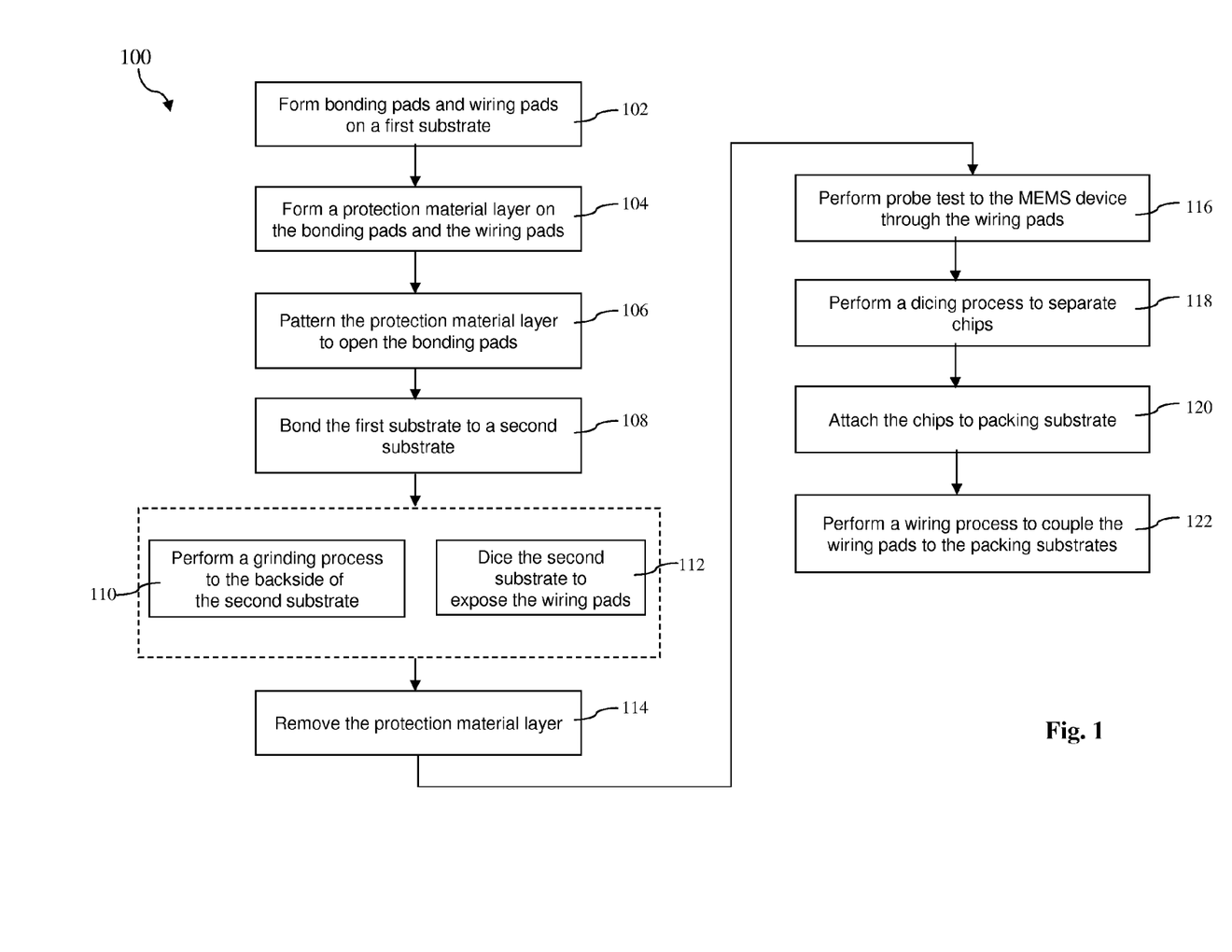
FIG. 1 is a flowchart of one embodiment of a method for forming an integrated circuit (IC).

FIG. 1 is a flowchart of one embodiment of a method 100 for forming an integrated circuit. FIGS. 2 through 9 illustrate sectional side views of an exemplary integrated circuit 200 during various fabrication stages of the method 100. With reference to FIGS. 1 through 9, the method 100 and the exemplary integrated circuit 200 are collectively described below. Additional steps can be provided before, during, and after the method 100, and some of the steps described below can be replaced or eliminated, for additional embodiments of the method.

Figure 2:
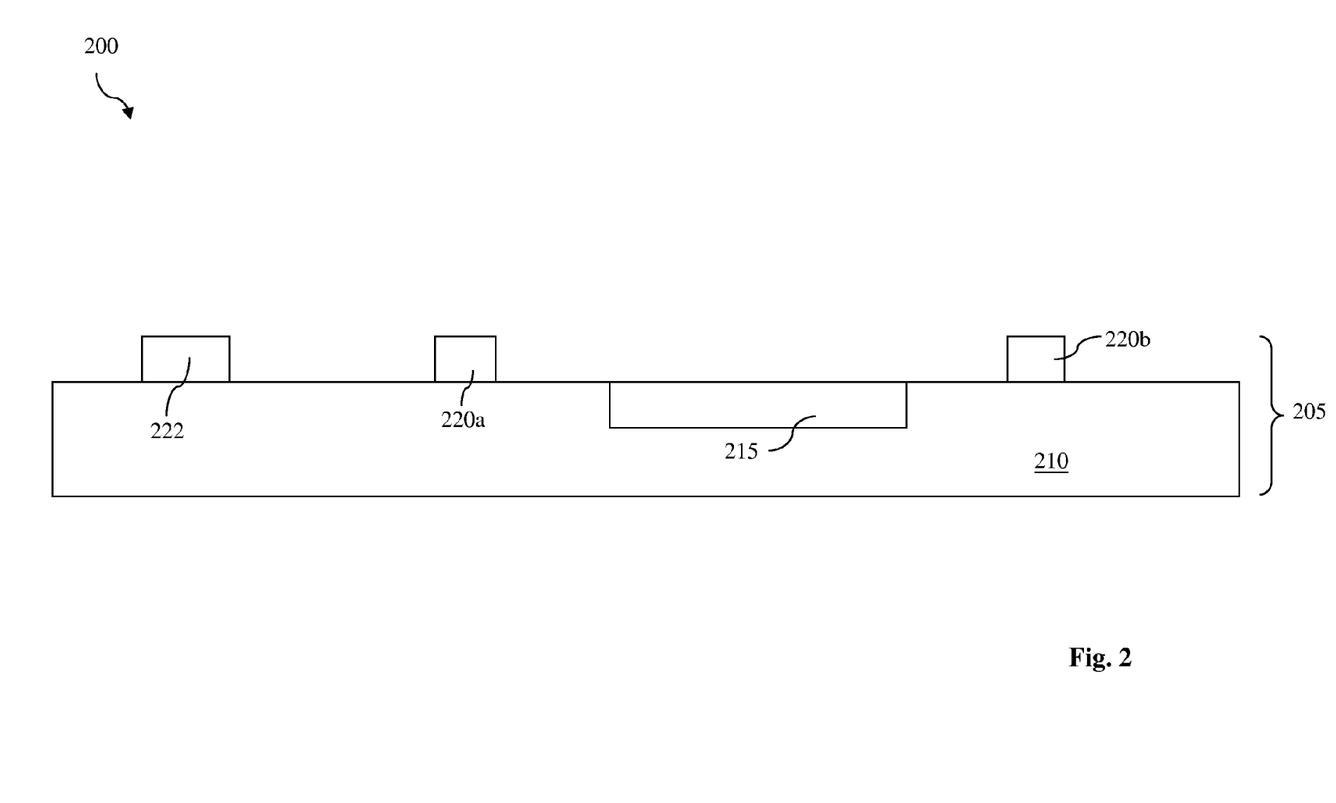
FIGS. 2 through 9 illustrate sectional side views of an exemplary integrated circuit during various fabrication stages, made by the method of FIG. 1.

Referring to FIGS. 1 and 2, the method begins at step 102 by forming bonding pads and wiring pads on a first wafer 205. The first wafer 205 includes a first substrate 210. The substrate 210 includes silicon. Alternatively, the substrate 210 may include another elementary semiconductor, such as germanium. The substrate 210 may also include a compound semiconductor, such as silicon carbide, gallium arsenic, indium arsenide, and indium phosphide. The substrate 210 may include an alloy semiconductor, such as silicon germanium, silicon germanium carbide, gallium arsenic phosphide, and gallium indium phosphide. The substrate 210 may include an epitaxial layer. For example, the substrate may have an epitaxial layer overlying a bulk semiconductor. Furthermore, the substrate 210 may include a semiconductor-on-insulator (SOI) structure. For example, the substrate may include a buried oxide (BOX) layer formed by a process such as separation by implanted oxygen (SIMOX). The substrate 210 includes various p-type doped regions and/or an n-type doped regions, implemented by a process such as ion implantation and/or diffusion. These doped regions in the substrate 210 may provide various functional devices or features such as a transistor or an imaging sensor. The substrate 210 may include lateral isolation features disposed to separate various devices formed on the substrate 210. For example, the substrate 210 includes shallow trench isolation (STI) formed by a process including lithography patterning process, etching, and dielectric material deposition. The substrate 210 may further include, at least partially, a plurality of patterned dielectric layers and patterned conductive layers combined to form interconnections configured to couple various p-type and n-type doped regions and other functional features. For example, the substrate 210 may include a portion of a multi-layer interconnect (MLI) structure and an inter-level dielectric (ILD) disposed in the MLI structure.

In one embodiment, the substrate 210 includes an integrated circuit (IC) device 215, such as a micro-electro mechanical system (MEMS) device. In one example, the MEMS device includes one or more movable features configured for the intended function, such that proper device packaging is needed to enable the function of the MEMS device. The IC device 215 may additionally include one or more field-effect transistors (FET), such as complimentary metal-oxide-semiconductor (MOS) transistors.

The first wafer 205 includes one or more bonding pads 220, such as bonding pads 220a and 220b, disposed on the substrate 210. The bonding pads 220 are designed for wafer bonding to provide proper packaging to the IC device 215. In one embodiment, the bonding pads 220 include a proper material to utilize eutectic bonding between wafers. For example, the bonding pads 220 includes gold. In another embodiment, the bonding pads 220 include one material selected from the group consisting of gold (Au), copper (Cu), indium (In), aluminum (Al), Tin (Sn), germanium (Ge), titanium (Ti), palladium (Pd), nickel (Ni) and silicon (Si), and proper combinations thereof. In another embodiment, the bonding pads 220 include a dimension, in a top view, ranging between about 10 microns and about 100 microns. For example, the bonding pads 220 include a round shape in the top view and include a diameter ranging between about 10 microns and about 100 microns. In another embodiment, the bonding pads 220 include an elongated shape, such as a bonding ring, having a width ranging between about 10 microns and about 100 microns. The bonding pads 220 can be formed by a proper technique, such as a process including deposition and etching.

The first wafer 205 also includes one or more wiring pads 222 disposed on the substrate 210. The wiring pads 222 are designed for proper electrical wiring from the IC device 215 to a packaging substrate or a printed circuit board (PCB). In one embodiment, the wiring pads 222 are electrically coupled to the IC device 215. In another embodiment, the wiring pads 222 include a proper conductive material. For example, the wiring pads 222 include aluminum or gold. In one embodiment, the wiring pads 222 include a dimension, in a top view, ranging between about 20 microns and about 100 microns. For example, the wiring pads 222 have a round shape in the top view and include a diameter ranging between about 20 microns and about 100 microns. The wiring pads 222 may include a diameter about 40, 60, 80, or 100 microns according to various examples. The wiring pads 222 can be formed by a proper technique, such as a process including deposition and etching. The bonding pads 220 and the wiring pads 222 can be formed simultaneously in one process or alternatively be formed separately with different materials and/or thicknesses (or height).

Figure 3:
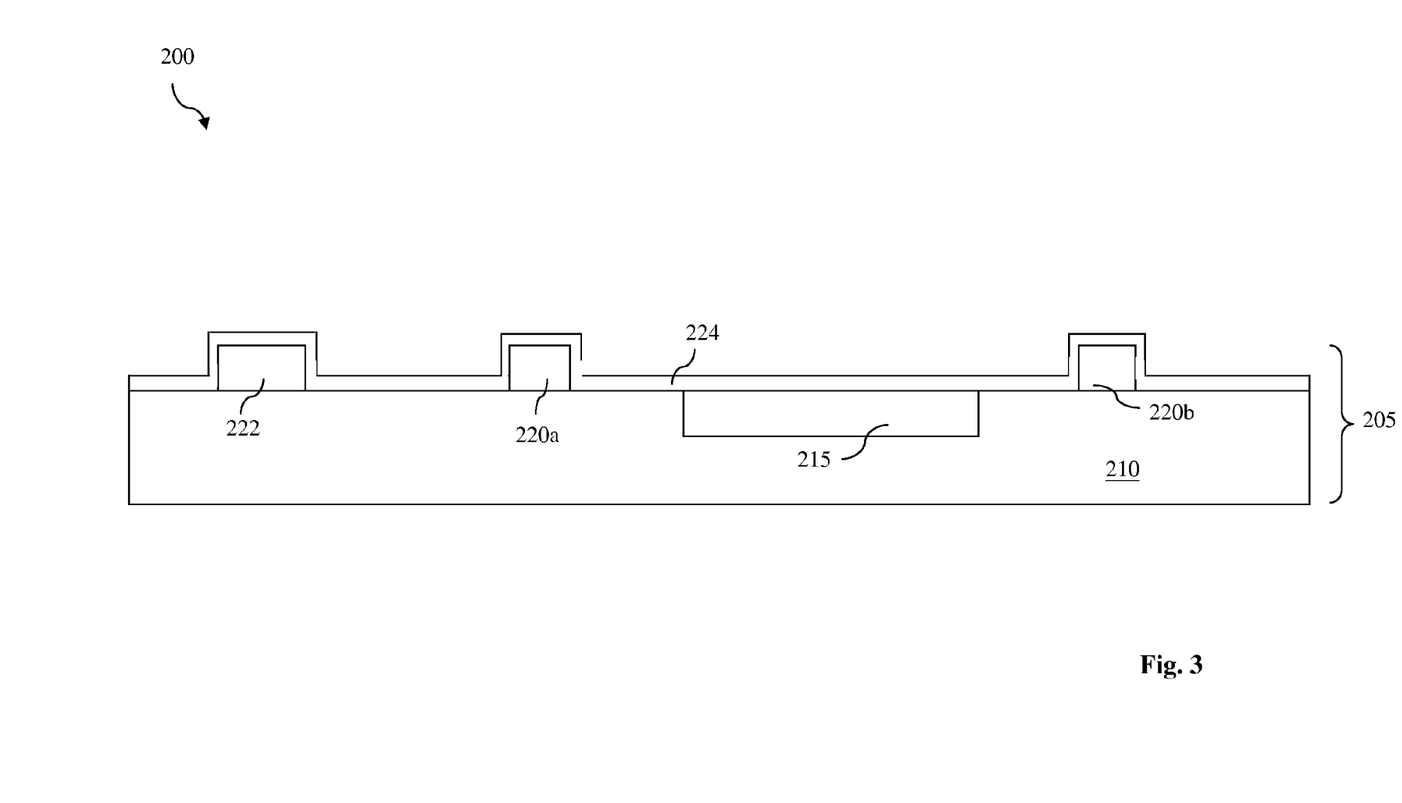

Referring to FIGS. 1 and 3, at step 104 of the method 100, a protection material layer 224 is formed on the first wafer 205. In one embodiment, the protection material layer 224 includes silicon oxide, silicon nitride, silicon oxynitride, amorphous silicon, amorphous carbon, diamond-like carbon (DLC), or other process compatible material, such as CMOS process compatible material. In another embodiment, the protection material layer 224 includes a photoresist (or resist) material. The protection material layer 224 can be formed by a proper technology, such as chemical vapor deposition (CVD), spin-on coating, or physical vapor deposition (PVD).

The protection material layer 224 is thick enough to protect the various features (e.g., the wiring pads) during subsequent process steps, such as grinding and dicing. The proper thickness of the protection material layer 224 may depend on the material characteristics of the protection material layer 224. In one embodiment, the protection material layer 224 includes a thickness greater than about 0.1 micron. In another embodiment, when a resist material is implemented as the protection material layer 224, the resist can be formed on the first wafer 205 using spin-on coating, such that the resist material substantially fills in the gaps between various bonding pads 220 and wiring pads 222. In this case, the protection material layer 224 has a thickness substantially equal to or greater than the thickness of the bonding pads and wiring pads.

Figure 4:
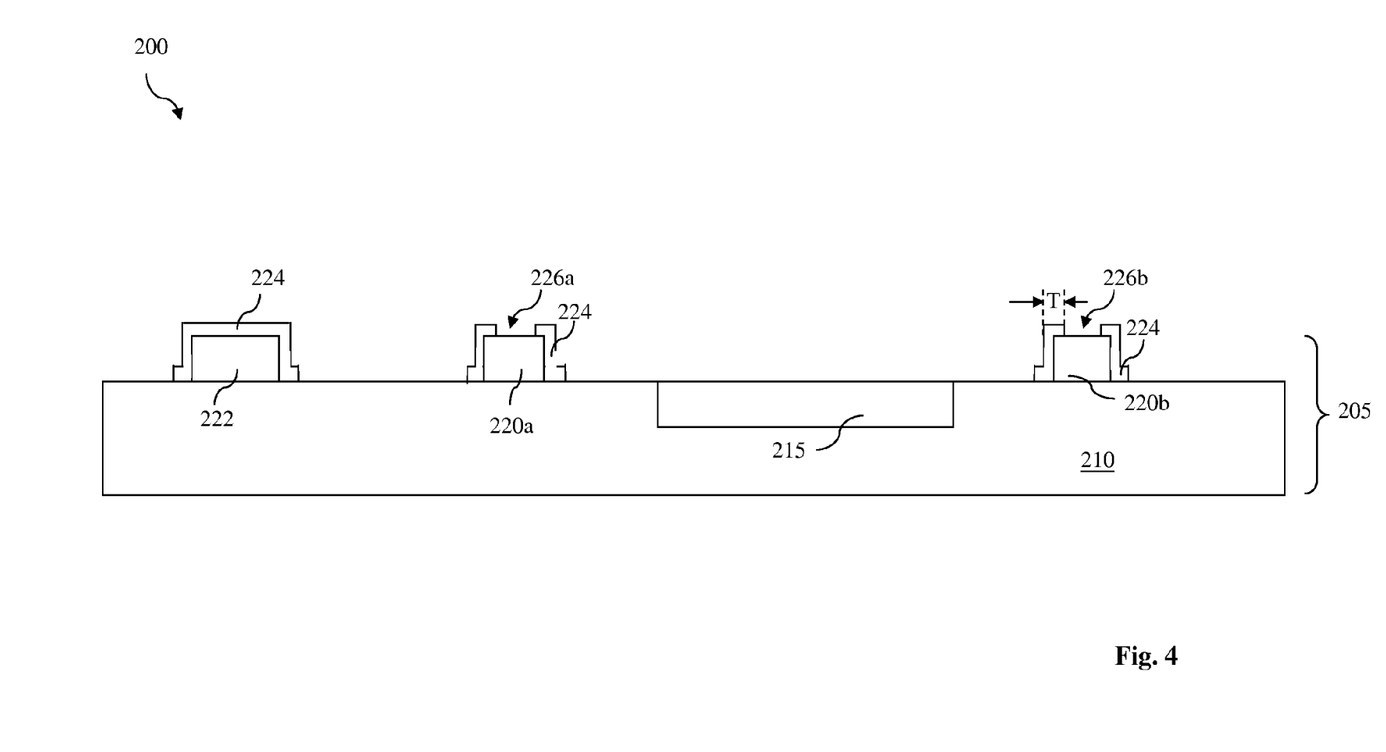

Referring to FIGS. 1 and 4, at step 106 of the method 100, the protection material layer 224 is patterned by a proper process. In one embodiment, the patterning process includes a lithography process and etching. In the lithography process, a resist layer is applied and patterned on the protection material layer 224, such that the openings of the patterned resist layer substantially expose top surfaces of the bonding pads 220. In one example, the resist layer may be applied on the substrate 210 by a spin-on coating and patterned by a lithography process, including exposing the resist layer to a radiation beam. The radiation beam may be a photon beam. For example, the resist layer is exposed to an ultraviolet (UV) light through a mask having a predefined pattern. The exposing process may be implemented using a stepper by a step-and-repeat method or using a scanner by a step-and-scan method. An exemplary lithography process to form a patterned resist layer may include processing steps of soft baking, mask aligning, exposing pattern, post-exposure baking, developing resist, and hard baking. The lithography process may be implemented or replaced by other proper methods, such as maskless patterning, electron-beam writing, or ion-beam writing.

The protection material layer 224 exposed within the openings of the patterned resist layer is etched away to at least partially expose the top surfaces of the bonding pads 220. The etching process may include a wet etching and/or a dry etching. In one example, a vapor hydrofluoric acid (HF) is used to etch the protection material layer 224 made of silicon oxide. In another example, a dilute hydrofluoric acid (DHF) is used to etch the protection material layer 224 made of silicon oxide. In addition or in the alternative, a dry etching process can be carried out in a gas-phase, with a chemical etching effect, a physical ion milling, and/or combinations thereof. In various embodiments, a plasma dry etching may utilize a partially ionized gas including F, Cl, O and/or H radicals. The patterned resist layer is wet striped or ashed thereafter.

The patterned protection material layer 224 covers sidewalls of the bonding pads 220. In the present embodiment, the patterned protection material layer 224 formed on the sidewalls of the bonding pads 220 has a height greater than the height of the bonding pads 220, forming a socket structure to function as a barrier wall for holding the squeezed-out eutectic compound during a subsequent bonding process. Thus, the squeezing-out issue is eliminated or reduced. The etching process is properly chosen and tuned to achieve the intended structure of the patterned protection material layer 224. In another embodiment, the patterned protection material layer 224 formed on the sidewalls of the bonding pads 220 is further extended to the top surfaces of the bonding pads 220 and may have a thickness "T" of about 1 micron or greater, as illustrated in FIG. 4.

Figure 5:
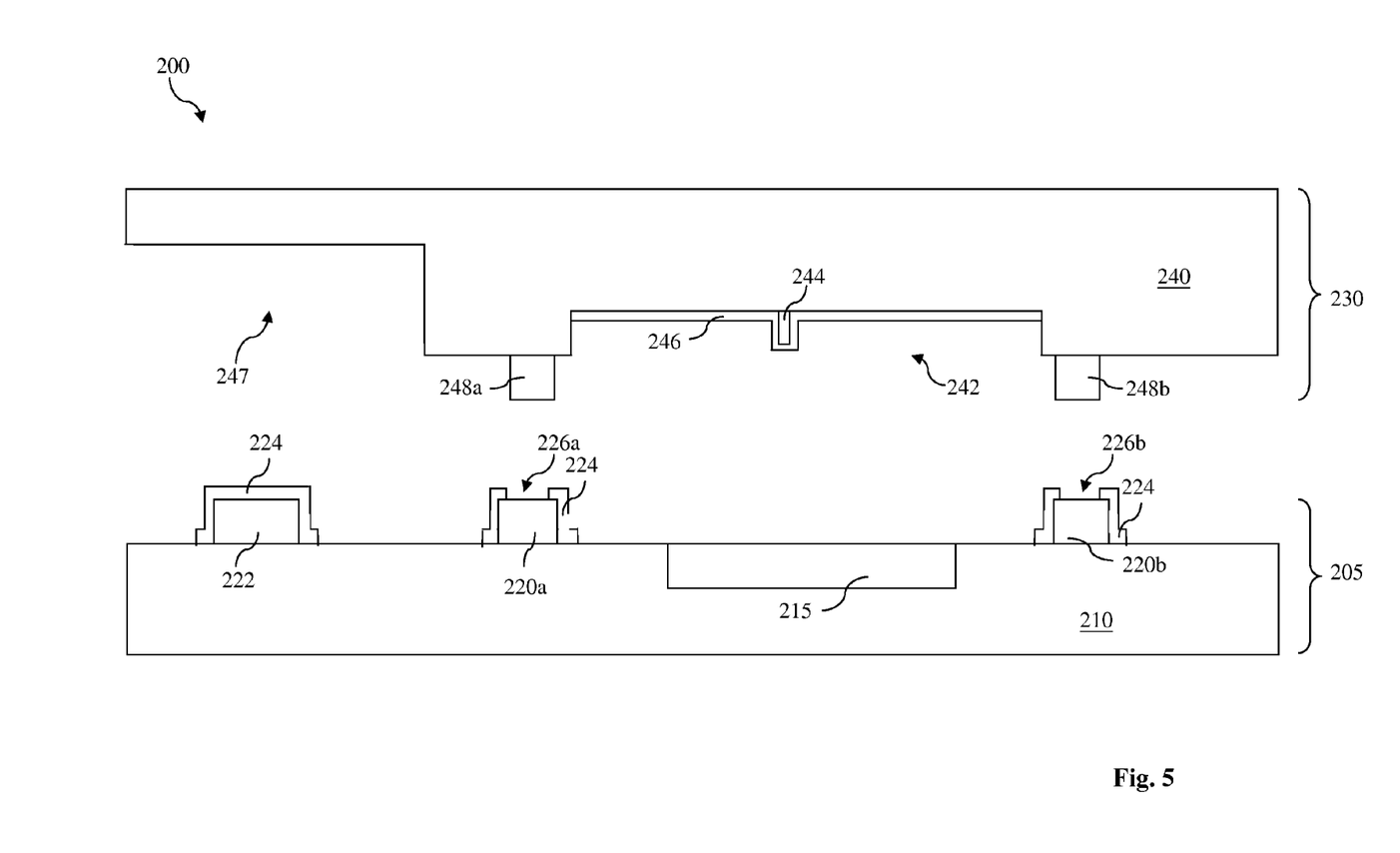
Figure 6:
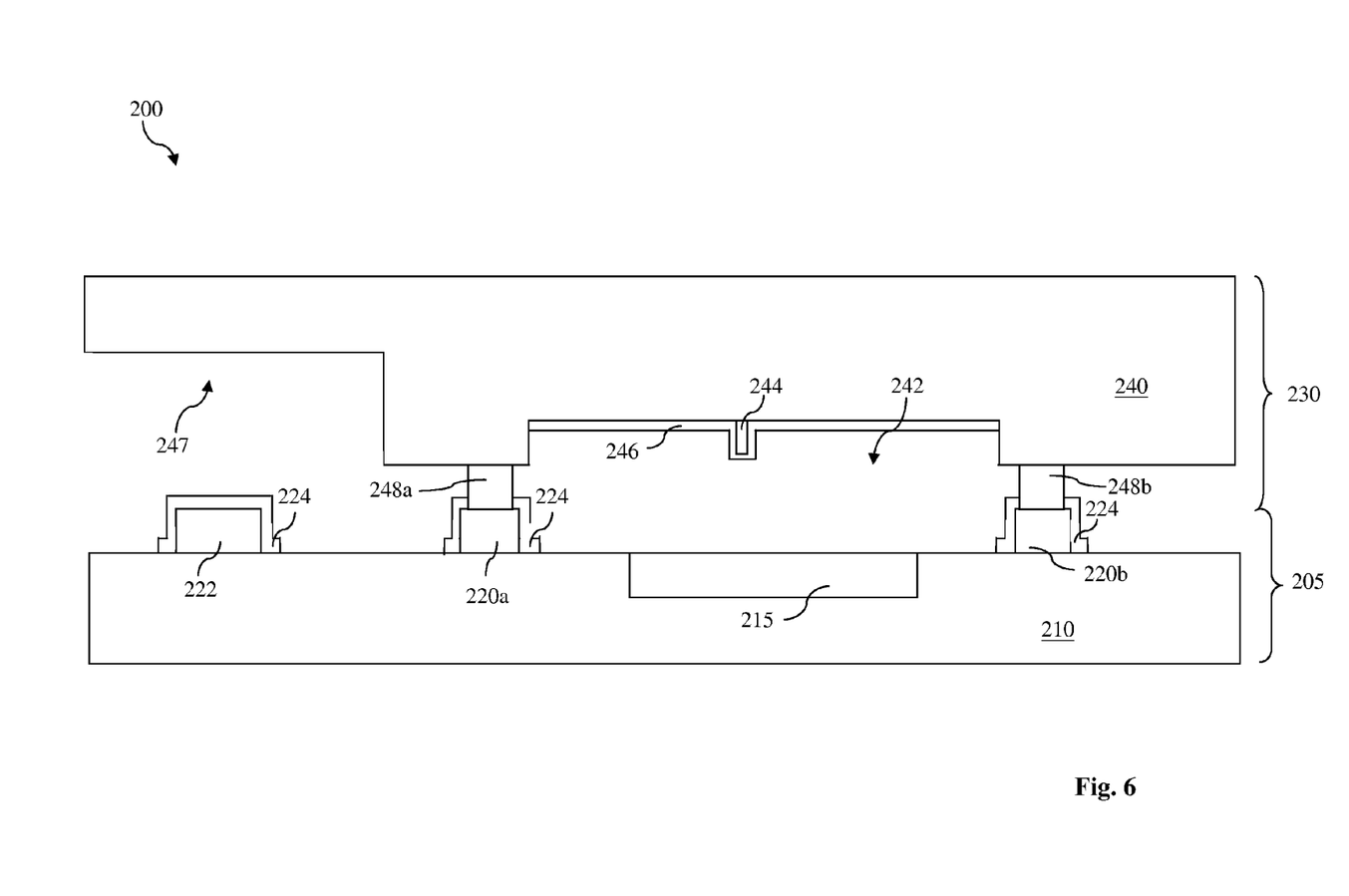

Referring to FIGS. 1, 5 and 6, at step 108 of the method 100, a second wafer 230 is bonded to the first wafer 205 using the bonding pads 220. The second wafer 230 includes a second substrate (or cap substrate) 240. In one example, the cap substrate 240 is a silicon substrate. In other examples, the cap substrate 240 may include other proper material. In one embodiment, the cap substrate 240 is processed to form one or more cavities 242 corresponding to the IC device 215 of the first wafer 205. The cavities 242 can be designed with proper geometry and dimensions to provide space for movable features of the IC device 215. The cavities 242 can be formed by a procedure that includes a lithography process and etching. The second wafer 230 may further include one or more post-like features 244 formed in the cavities 242 and designed to prevent sticking issues of the moving features in the IC device 215. The post-like features 244 may additionally or alternatively function to confine the motion of the movable features of the IC device 215, therefore, the post-like features 244 are also referred to as stoppers. In another embodiment, the second wafer 230 further includes an anti-stiction layer 246 having a proper material to reduce surface adhesion forces, such that the mechanical restoring force of the movable features of the IC device 215 (such as the MEMS device) is greater than the surface adhesive force. Thus, the sticking/attaching of the movable features of the IC device 215 to the second wafer 230 is eliminated or reduced. In another embodiment, a chlorosilane-based coating is used for the anti-stiction layer 246. In another embodiment, dichlorodimethylsilane is used to form the anti-stiction layer 246. In another embodiment, a vapor phase process may be used to form the anti-stiction layer 246.

The second wafer 130 further includes a deep trench 247 formed on the surface adjacent the first wafer 205. The deep trench 247 is formed in the region corresponding to the wiring pads 222 so that the deep trench 247 is aligned with the wiring pads 222 after the first wafer 130 and the second wafer 230 are bonded together. The deep trench 247 can be formed by implementing an etching process. In one embodiment, the etching process applied to form the deep trench 247 includes deep reactive-ion etching (DRIE) as a highly anisotropic etch process used to create deep, steep-sided holes and trenches in wafers. The DRIE may uses a technology including cryogenic and Bosch. The deep trench 247 is designed to reduce the thickness of the second wafer 230 in the region aligned to the wiring pads 222 where the second wafer 230 will be opened to expose the wiring pads 222 in a subsequent step. By reducing the thickness of the second wafer 230 in the region of the wiring pads 230, the second wafer 230 can be opened in the corresponding region with additional dicing and/or grinding to the second substrate 230.

The second wafer 230 further includes bonding pads 248, such as bonding pads 248a and 248b, formed on the cap substrate 240 and positioned to be aligned with the bonding pads 220 of the first wafer 205, respectively. The bonding pads 248 have proper geometry similar to the bonding pads 220 and may have a dimension equal to or less than the corresponding dimension of the bonding pads 220. For example, the bonding pads 248 include a dimension, in a top view, ranging between about 10 microns and about 100 microns. In one embodiment, the bonding pads 248 use a suitable material to enable eutectic bonding with the bonding pads 220. In various embodiments, the bonding pads 248 include gold (Au), copper (Cu), indium (In), aluminum (Al), Tin (Sn), germanium (Ge), titanium (Ti), palladium (Pd), nickel (Ni) and silicon (Si). In a more particular example, the bonding pads 220 and the bonding pads 248 use a pair of materials (such as gold and tin), respectively. Other pairs of materials include gold (Au) and indium (In), copper (Cu) and copper (Cu), aluminum (Al) and germanium (Ge), aluminum (Al) and tin (Sn), titanium (Ti) and aluminum (Al), aluminum (Al) and nickel (Ni), and aluminum (Al) and silicon (Si).

The first wafer 205 and the second wafer 230 are bonded together through the bonding pads 220 and 248 by a bonding process, as illustrated in FIG. 6. In one embodiment, the bonding process implements eutectic bonding technology. In another embodiment, the bonding process includes applying thermal energy and mechanical pressure to the bonding pads 220 and 248. During the eutectic bonding, the eutectic compound is formed and has a reduced melting point to enhance the bonding effect at a relatively lower temperature, which is equal to or greater than the melting point of the eutectic compound. During the bonding process, the eutectic compound is partially squeezed out from the bonding regions. The patterned protection material layer 224 includes a vertical portion on the sidewalls of the bonding pads 220. The vertical portion of the protection material layer 224 can effectively prevent the squeezing-out of the eutectic compound and eliminate device shorting issues. In other alternative embodiments, the bonding process may use other bonding procedures, such as diffusion.

Figure 7:
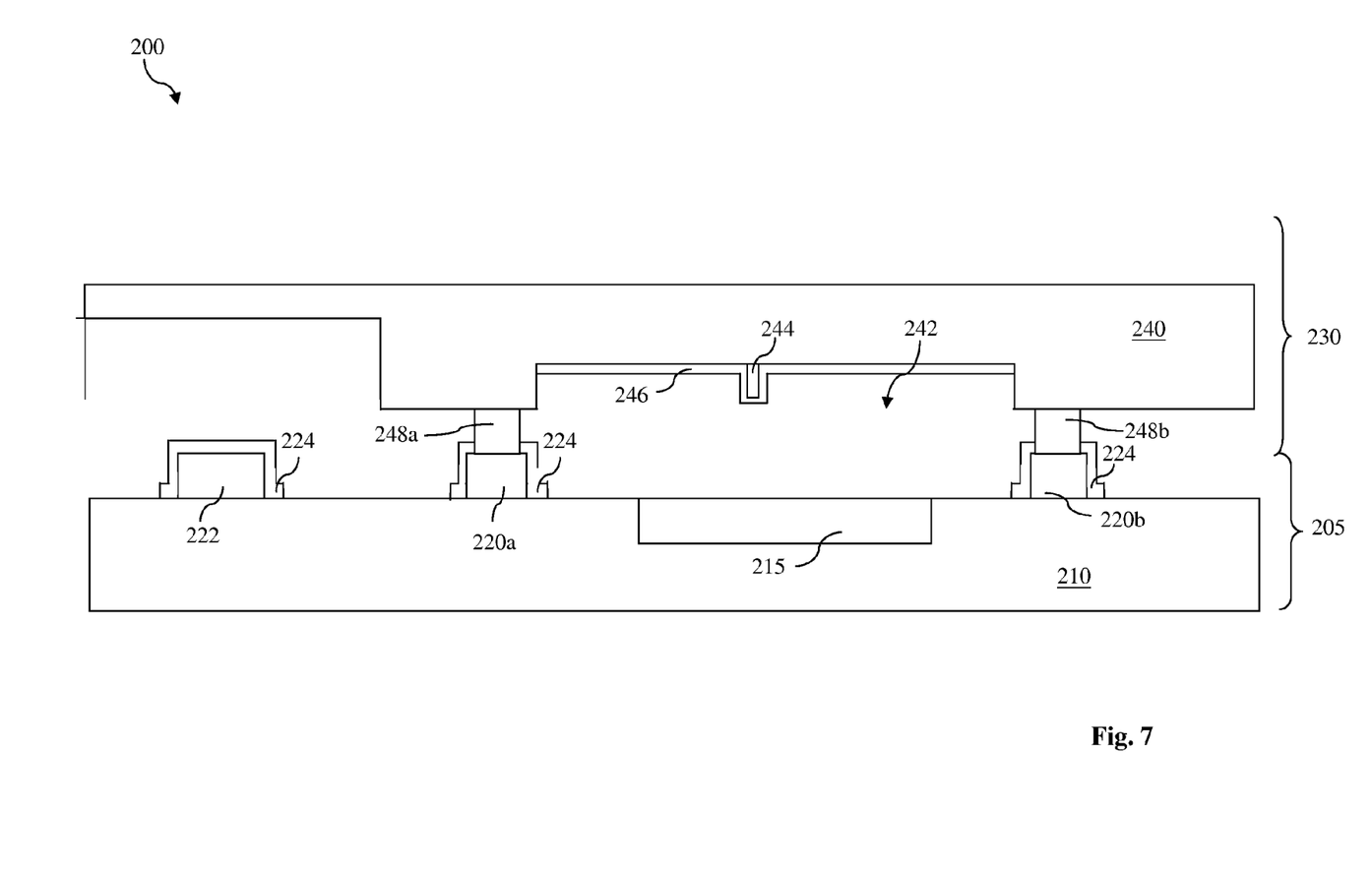

Referring to FIGS. 1 and 7, at step 110 of the method 100, a grinding process may be applied to the backside of the second wafer 230, such that the cap substrate 240 is substantially thinned down. In one example, the cap substrate 240 is thinned down from about 700 microns thick or more to about 30 microns thin or less. In the grinding process, a grinder wheel is applied to the backside of the cap substrate 240 to reduce the thickness of the cap substrate 240. In one embodiment, the grinding process can implemented to completely consume the substrate 240 of the second wafer 230 in the region of the wiring pads 222. In this case, the second wafer 230 is opened in the region of the wiring pads 222 to expose the wiring pads 222 after the completion of the grinding process.

Figure 8:
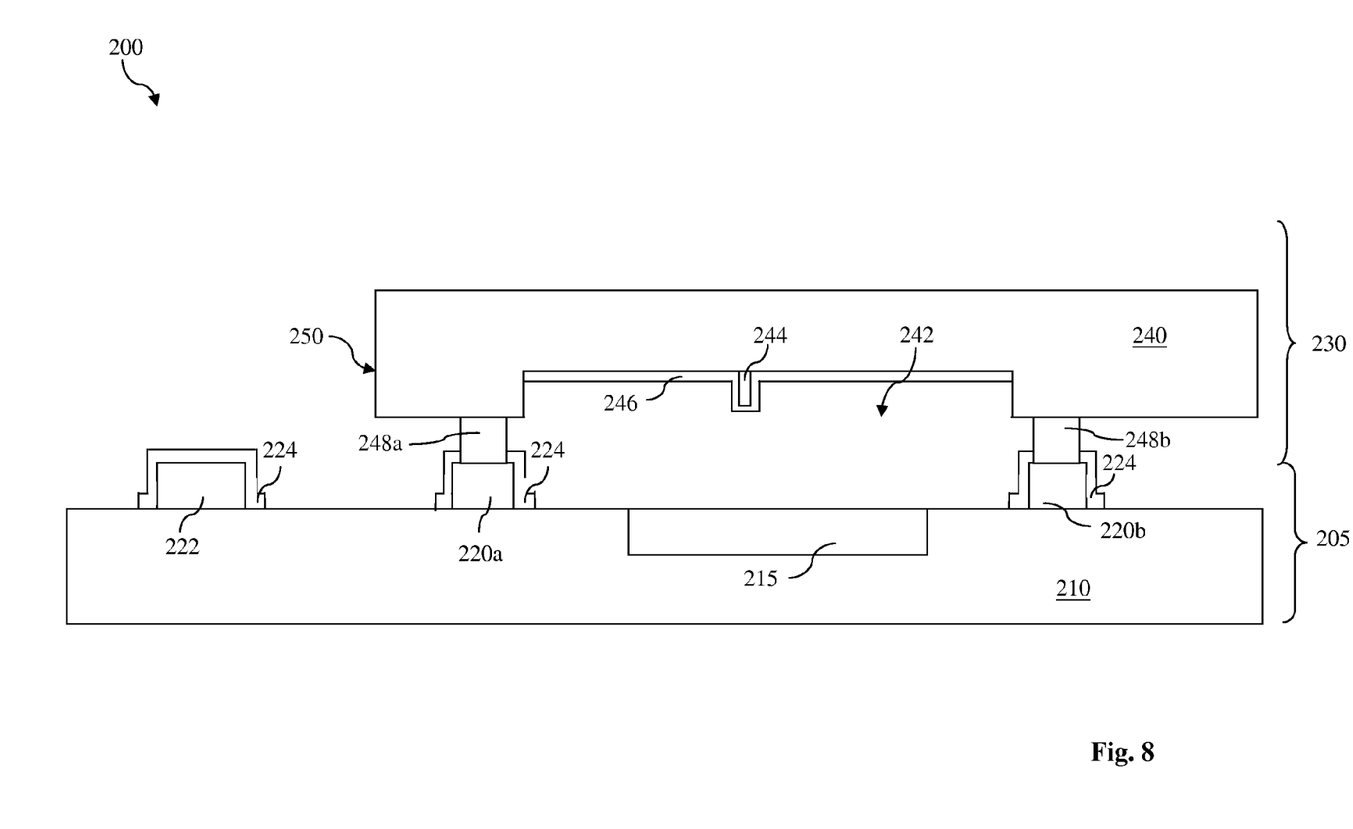

Referring to FIGS. 1 and 8, at step 112 of the method 100, a dicing process is applied to the cap substrate 240 at locations, such that one or more portion of the second wafer 230 are removed and the wiring pads 222 are uncovered from the cap substrate 240. The dicing process is only applied to the second wafer 230 to expose the wiring pads 222, therefore referred to as partial dicing. Since the deep trench 247 formed in the second wafer 230, the dicing process can open the second wafer 230 within the deep trench 247 easily. The grinding process at step 110 and the dicing process at step 112 can be alternatively applied to the second wafer 230 to open the second wafer. In another embodiment, the grinding process and the dicing process are collectively applied to the second wafer. In this case, the thickness of the substrate 240 is reduced by the grinding process and then the dicing process open the second wafer 230.

During the dicing process and/or grinding processes, particles or broken fragments are generated. In conventional methods, the wiring pads 222 can be further scratched, damaged, or shorted by the introduced particles and broken fragments. In contrast, in the disclosed method, the protection material layer 224 effectively protects the wiring pads 222 from such damage or electrical short.

Figure 9:
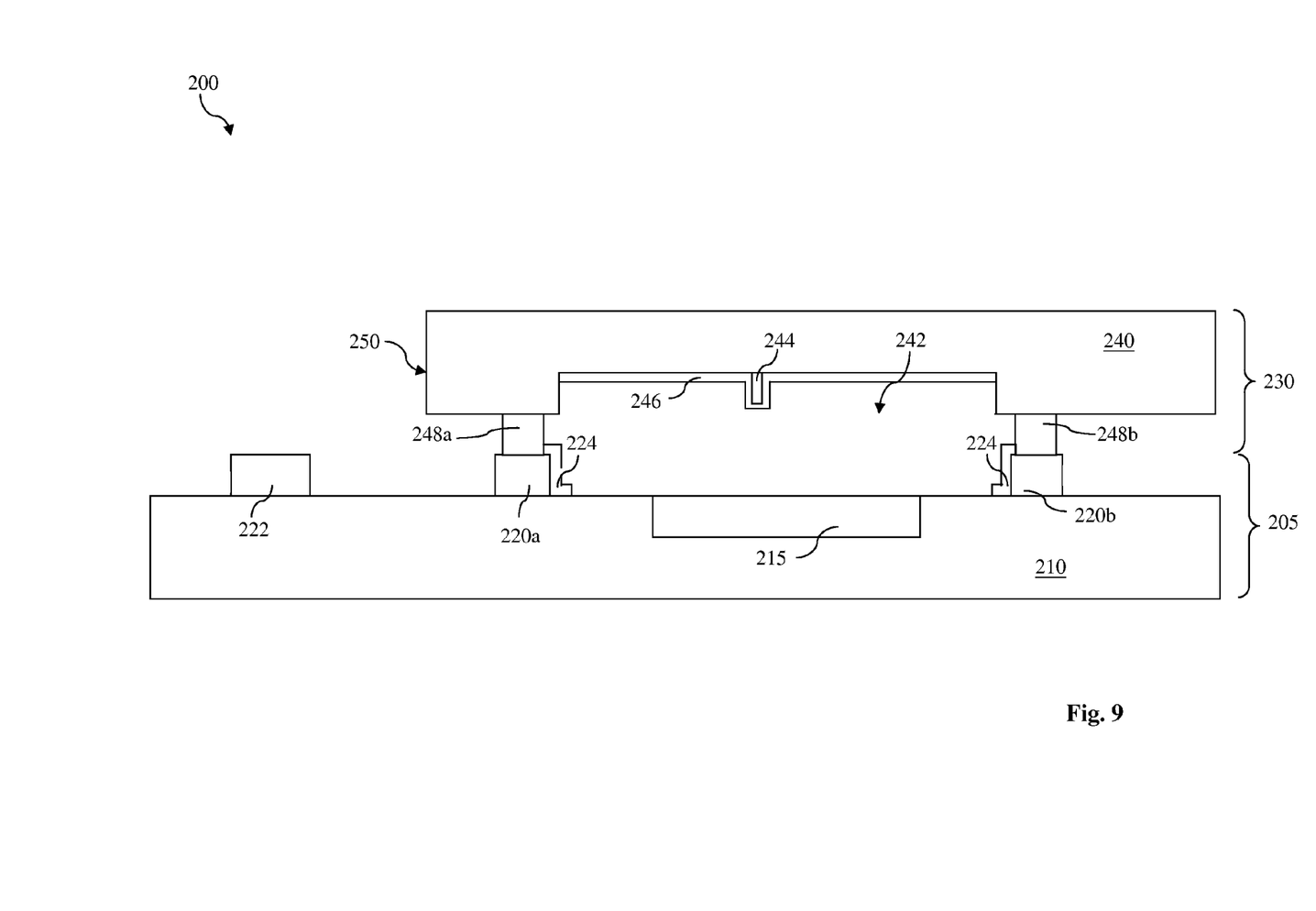

Referring to FIGS. 1 and 9, at step 114 of the method 100, the protection material layer 224 is at least partially removed by a process, such as etching. The particles or broken fragments introduced by the grinding and the dicing at previous steps are removed with the protection material layer 224 as well. The etching process includes a wet etching process, a plasma etching process, or combinations thereof. The etchant for the etching process is properly chosen and tuned to be compatible with other materials, such as the anti-stiction layer 246. In other words, the etchant in the etching process can selectively remove the protection material layer 224 without apparent damage and etching to the anti-stiction layer 246. In one example, when the protection material layer 224 includes amorphous carbon, an oxygen containing plasma (or O2 plasma) process is implemented to remove the protection material layer 224. In another example, when the protection material layer 224 includes silicon oxide, a vapor HF chemical or DHF is applied to remove the protection material layer 224.

The method 100 may further include other processing steps before, during, and after the described processing steps 102-114. In one example, after the removal of the protection material layer 224 at step 116, a probe test 116 may be implemented at the wafer lever through the exposed wiring pads 222 for qualification, sorting, or other purposes since the wiring pads 222 are now open and free of the protection material layer 224. In another example, a second dicing process 118 is applied to the bonded first wafer 205 and the second wafer 230 to separate device chips (or dies). The second dicing process may be similar to the dicing process at step 112 in dicing technology. In yet another example, the method 100 further includes a step 120 to attach the diced chips to packing substrates, respectively, using a technology known in the art or to be developed. In yet another example, the method 100 further includes a step 122 to perform a wiring process to couple the wiring pads 222 to respective packaging substrates. In one embodiment, the wiring process uses a gold line to attach to the wiring pad in one end and attach to the respective packaging substrate at another end. In an alternative embodiment, the wiring pads can be electrically coupled to the packaging substrate using other technology, such as bump.

Although the method 100 is described in detail, other alternatives and processing steps may be included. For example, the IC device 215 may include one or more micro-minors for various applications including display, optical switch, and mask-less exposure. In another example, the IC device 215 includes one or more micro-cantilever beams designed for various applications including micro-sensor and accelerometer. The first wafer 205 may include various MOS transistors and integrated circuits formed thereby to drive and control the micro-minors. In another embodiment, the first wafer 205 includes MOS transistors and a driver circuit designed for controlling the IC device 215. The various bonding pads can be designed in different configurations, geometry, and dimensions for various purposes. In another embodiment, the bonding pads 220 can be constructed to be discontinuous around the IC device 215. The bonding pads 248 are constructed similarly as well. In yet another embodiment, the bonding pads 220 can be constructed to form a continuous ring around the IC device 215. The bonding pads 248 can be constructed similarly.

Figure 10:
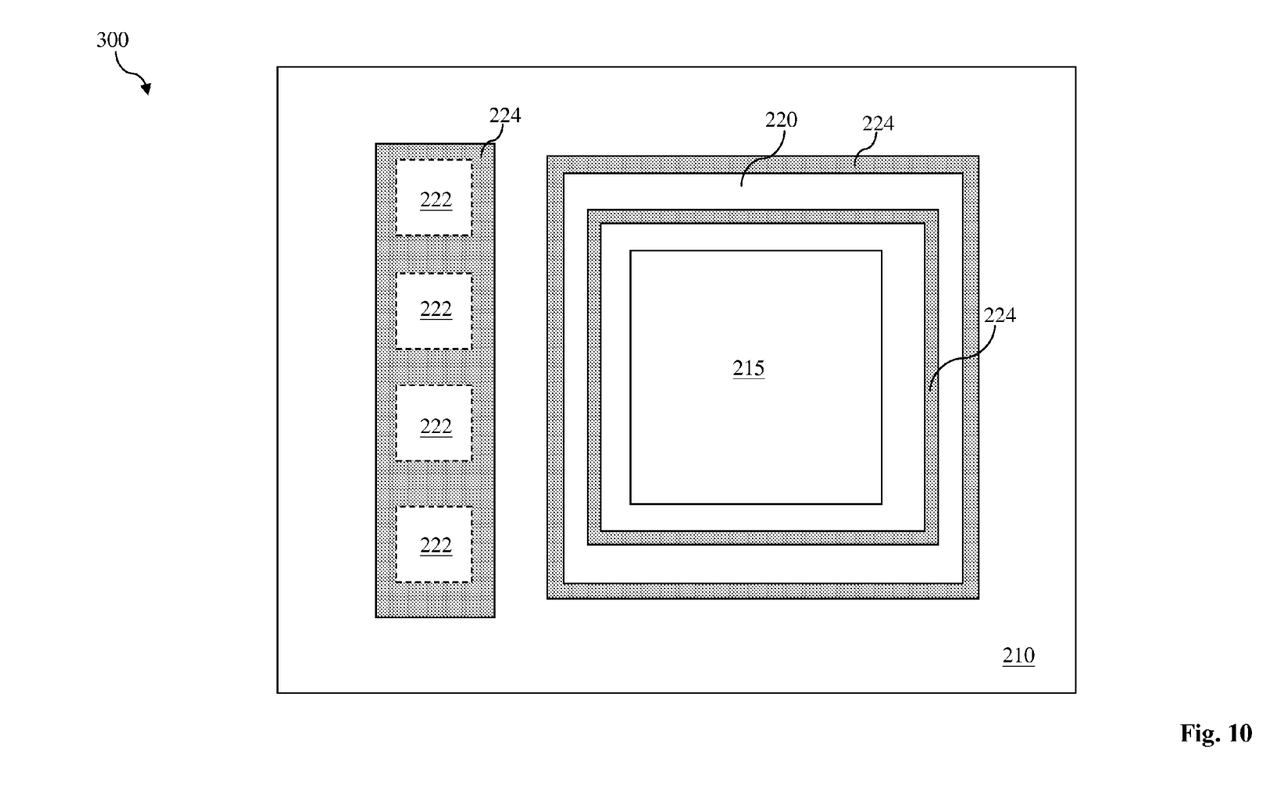
FIG. 10 illustrates a top view of one embodiment of an integrated circuit structure constructed according to aspects of the present disclosure.

FIG. 10 illustrates a top view of one embodiment of an integrated circuit (IC) structure 300 constructed according to aspects of the present disclosure. The IC structure device 300 includes a portion of the IC device 200 of FIG. 4 having various bonding pads and wiring pads constructed according to various aspects of the present disclosure. The IC structure 300 includes IC device 215 formed on the first substrate 210. The IC structure 300 includes the bonding pad 220 constructed as a continuous bonding ring around the IC device 215 and formed on the first substrate 210.

The IC structure 300 also includes wiring pads 222 constructed as an array proximate to and coupled with the IC device 215. The wiring pads 222 are also formed on the first substrate 210. The protection material layer 224 is deposited and patterned to be adjacent the wiring pads 222 and the bonding pad 220. The protection material layer 224 covers the wiring pads 222 from sidewalls and top surfaces, such that the wiring pads 222 are substantially sealed by the protection material layer 224. The protection material layer 224 covers the bonding pad 220 from sidewalls and exposes the bonding pad's corresponding top surface for bonding purposes. In one embodiment, the bonding pad 220 includes a width ranging between about 10 microns and about 100 microns. In another embodiment, the wiring pad 222 include a dimension ranging between about 20 microns and about 100 microns. In another embodiment, the bonding pad(s) 220 and the wiring pads 222 can be simultaneously formed in a same processing procedure including deposition and etching.

Figure 11:
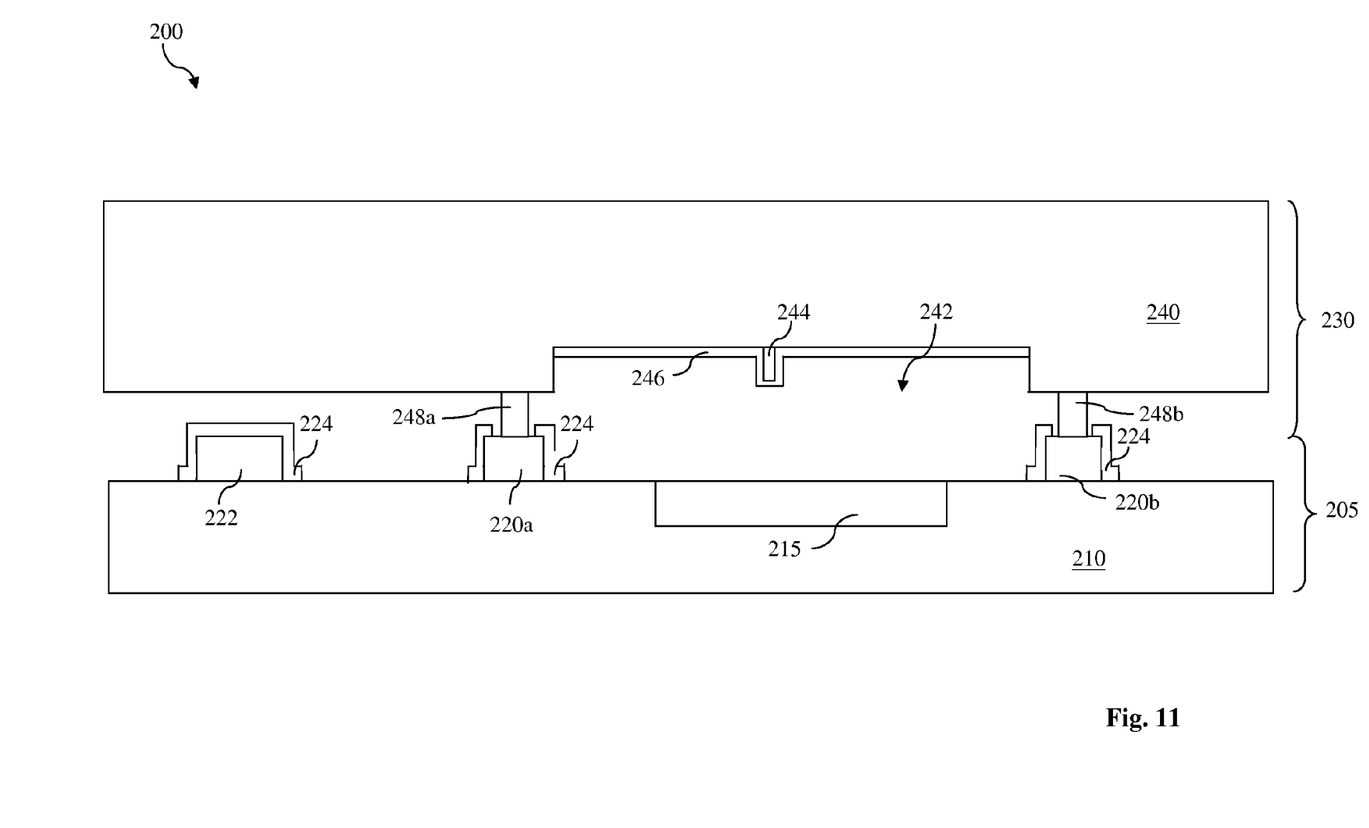
FIG. 11 illustrates a sectional side view of another embodiment of an integrated circuit structure constructed according to aspects of the present disclosure.

FIG. 11 illustrates a sectional side view of another embodiment of the integrated circuit structure 200 constructed according to aspects of the present disclosure. In FIG. 11, the bonding pads 248 of the second substrate 240 have a width less than a width of the bonding pads 220 of the first substrate 210, such that a gap is formed between the bonding pads 248 and a portion of the protection material layer 224 formed on sidewalls of the bonding pads 220. The squeezed-out eutectic compound can be kept within the gap to avoid shorting and other damage.

The protection material layer can be formed using different material, different procedure, and/or different structure according to various embodiments. For example, the protection material layer may include a multi-film structure. In another embodiment, the method 100 for forming an integrated circuit may include different procedures for forming the protection material layer. In furtherance of the embodiment, a metal layer is formed on the first substrate 210; an amorphous carbon layer is formed on the metal layer; and then a silicon oxide layer (such as plasma enhanced CVD oxide or PEOX) is formed on the amorphous carbon layer. The metal layer, the amorphous carbon layer, and the silicon oxide layer are patterned to form the bonding pads 220 and the wiring pads 222. A protection material layer 224 is formed to cover sidewalls of the bonding pads (or bonding ring) 220, resulting in a socket structure, by a process including deposition, lithography process, and etching. The resist layer is removed afterward by oxygen plasma ashing, leaving the silicon oxide to protect the amorphous carbon from damage. Other processes may be implemented to the IC device 215, such as an anti-stiction coating. The silicon oxide layer is removed then by an etchant, such as dilute HF or vapor HF. The wafer bonding is implemented through the bonding pads 220 and 248.

Thus, the present disclosure provides a method of manufacturing a microelectronic device. The method includes forming a bonding pad on a first substrate; forming wiring pads on the first substrate; forming a protection material layer on the first substrate, on sidewalls and top surfaces of the wiring pads, and on sidewalls of the bonding pad such that a top surface of the bonding pad is at least partially exposed; bonding the first substrate to a second substrate through the bonding pad; opening the second substrate to expose the wiring pads; and removing the protection material layer.

In one embodiment, the forming a protection material layer on the first substrate includes depositing the protection material layer on the first substrate; and patterning the protection material layer to expose the top surface of the bonding pad. In other embodiments, the forming the protection material layer includes forming a layer of material selected from the group consisting of silicon oxide, silicon nitride, silicon oxynitride, amorphous silicon, amorphous carbon, and diamond-like carbon (DLC). In another embodiment, the patterning the material layer includes etching the protection material layer using vapor hydrofluoric acid (HF). In another embodiment, the opening the second substrate by at least one of dicing and grinding the second substrate. In another embodiment, the method further includes dicing the first and second substrate to form a plurality of device chips; attaching the plurality of device chips to respective packaging substrates; and forming electrical wires from the wiring pads to the respective packaging substrates. In yet another embodiment, the opening the second substrate further includes performing a grinding process to the second substrate. In yet another embodiment, the opening the second substrate includes implementing a partial dicing process to the second substrate. In yet another embodiment, the bonding the first substrate to a second substrate through the bonding pads includes implementing an eutectic bonding. In yet another embodiment, the forming the bonding pad includes forming the bonding pad with a material selected from the group consisting of gold (Au), copper (Cu), indium (In), aluminum (Al), Tin (Sn), germanium (Ge), titanium (Ti), palladium (Pd), nickel (Ni) and silicon (Si). The microelectronic device includes a micro-electro-mechanical system (MEMS) device.

The present disclosure also provides another embodiment of a method. The method includes forming a microelectronic device on a first substrate; forming a first bonding pad on the first substrate and around the microelectronic device; forming wiring pads on the first substrate and proximate to the microelectronic device; forming a protection material layer on the first substrate, substantially covering the wiring pads, and at least partially exposing a top surface of the bonding pad; forming a second bonding pad on a second substrate; bonding the first substrate to the second substrate through the first and second bonding pads; exposing the wiring pads by at least one of dicing and grinding the second substrate; and removing the protection material layer.

In one embodiment, the first bonding pad and the second bonding pad are aligned and include a first material and a second material, respectively. A set of the first and second materials is selected from the group consisting of gold (Au) and tin (Sn), gold (Au) and indium (In), copper (Cu) and copper (Cu), aluminum (Al) and germanium (Ge), aluminum (Al) and tin (Sn), titanium (Ti) and aluminum (Al), aluminum (Al) and nickel (Ni), and aluminum (Al) and silicon (Si). In yet another embodiment, the removing the protection material layer includes applying an etching process using one of vapor hydrofluoric acid (HF) and O2 plasma. In yet another embodiment, the bonding the first substrate to the second substrate uses an eutectic bonding process. The method further includes performing a grinding process to the second substrate from a backside before the dicing the second substrate.

The present disclosure also provides another embodiment of a method. The method includes forming a microelectronic device on a first substrate; forming a first bonding pad on the first substrate and around the microelectronic device; forming a protection material layer on the first substrate; patterning the protection material layer such that the protection material layer at least partially exposes a top surface of the first bonding pad and has a portion covering sidewalls of the first bonding pads, the portion of the protection material layer having a top surface higher than the top surface of the first bonding pad; and bonding the first substrate to a second substrate through the first bonding pad.

In one embodiment, the portion of the protection material layer is partially extended to the top surface of the first bonding pad. In another embodiment, the method further includes forming wiring pads on the first substrate and approximate the microelectronic device before the bonding; grinding or partially dicing the second substrate to expose the wiring pads; and afterward removing the protection material layer. In yet another embodiment, the method further includes forming a second bonding pad on the second substrate before the bonding, the bonding the first substrate to the second substrate utilizing an eutectic bonding between the first and second bonding pads.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for manufacturing a microelectronic device, comprising:
    forming a bonding pad on a first substrate;
    forming wiring pads on the first substrate;
    forming a protection material layer on the first substrate, on sidewalls and top surfaces of the wiring pads, and on sidewalls of the bonding pad, such that a top surface of the bonding pad is at least partially exposed;
    bonding the first substrate to a second substrate through the bonding pad;
    opening the second substrate to expose the wiring pads; and
    removing the protection material layer.

2. The method of claim 1, wherein the forming a protection material layer on the first substrate includes:
    depositing the protection material layer on the first substrate; and
    patterning the protection material layer to expose the top surface of the bonding pad.

3. The method of claim 2, wherein the forming the protection material layer includes forming a layer of material selected from the group consisting of silicon oxide, silicon nitride, silicon oxynitride, amorphous silicon, amorphous carbon, and diamond-like carbon (DLC).

4. The method of claim 2, further comprising forming a deep trench in the second substrate before the bonding the first substrate to the second substrate, wherein the deep trench faces the first substrate and is aligned with the wiring pads after the bonding the first substrate to the second substrate.

5. The method of claim 1, further comprising:
    dicing the first and second substrate to form a plurality of device chips;
    attaching the plurality of device chips to respective packaging substrates; and
    forming electrical wires from the wiring pads to the respective packaging substrates.

6. The method of claim 1, wherein the opening the second substrate includes performing a grinding process to the second substrate.

7. The method of claim 1, wherein the opening the second substrate includes implementing a partial dicing process to the second substrate.

8. The method of claim 1, wherein the bonding the first substrate to the second substrate through the bonding pad includes implementing an eutectic bonding.

9. The method of claim 1, wherein the forming the bonding pad includes forming the bonding pad with a material selected from the group consisting of gold (Au), copper (Cu), indium (In), aluminum (Al), Tin (Sn), germanium (Ge), titanium (Ti), palladium (Pd), nickel (Ni) and silicon (Si).

10. The method of claim 1, wherein the microelectronic device includes a micro-electro-mechanical system (MEMS) device.

11. A method, comprising:
    forming a microelectronic device on a first substrate;
    forming a first bonding pad on the first substrate and around the microelectronic device;
    forming wiring pads on the first substrate and proximate to the microelectronic device;
    forming a protection material layer on the first substrate, substantially covering the wiring pads, and at least partially exposing a top surface of the bonding pad;
    forming a second bonding pad on a second substrate;
    bonding the first substrate to the second substrate through the first and second bonding pads;
    exposing the wiring pads by at least one of dicing and grinding the second substrate; and
    removing the protection material layer.

12. The method of claim 11, wherein the first bonding pad and the second bonding pad are aligned and include a first material and a second material, respectively.

13. The method of claim 12, wherein a set of the first and second materials is selected from the group consisting of gold (Au) and tin (Sn), gold (Au) and indium (In), copper (Cu) and copper (Cu), aluminum (Al) and germanium (Ge), aluminum (Al) and tin (Sn), titanium (Ti) and aluminum (Al), aluminum (Al) and nickel (Ni), and aluminum (Al) and silicon (Si).

14. The method of claim 11, wherein the removing the protection material layer includes applying an etching process using one of vapor hydrofluoric acid (HF) and O2 plasma.

15. The method of claim 11, wherein the bonding the first substrate to the second substrate includes using an eutectic bonding process.

16. The method of claim 11, further comprising forming a deep trench to the second substrate in a region corresponding to the wiring pads.

17. A method, comprising:

forming a microelectronic device on a first substrate;

forming a first bonding pad on the first substrate and around the microelectronic device;

forming a protection material layer on the first substrate;

patterning the protection material layer such that the protection material layer at least partially exposes a top surface of the first bonding pad and has a portion covering sidewalls of the first bonding pads, wherein the portion of the protection material layer is partially extended to the top surface of the first bonding pad;

bonding the first substrate to a second substrate through the first bonding pad;

exposing a wiring pad on the first substrate by removing a portion of the second substrate; and forming the wiring pad on the first substrate proximate to the microelectronic device before the bonding; and afterward removing the protection material layer, wherein exposing the wiring pad on the first substrate by removing the portion of the second substrate includes exposing the wiring pad by at least one of dicing and partially grinding the second substrate.

18. The method of claim 17, further comprising forming a second bonding pad on the second substrate before the bonding, the bonding the first substrate to the second substrate utilizing an eutectic bonding between the first and second bonding pads.

19. The method of claim 17, wherein bonding the first substrate to the second substrate through the first bonding pad includes bonding the first bonding pad to a second bonding pad on the second substrate, wherein the first bonding pad has a first width and the second bonding pad has a second width that is less than the first width such that a gap is formed between the second bonding pad and the portion of the protection material layer on the first bonding pad when the first bonding pad is bonding to the second bonding pad.

20. The method of claim 17, wherein patterning the protection material layer further includes removing portions of the protection material layer over the microelectronic device to expose a top surface of the microelectronic device.

* * * * *